US011923283B2

(12) United States Patent
Kwak

(10) Patent No.: US 11,923,283 B2
(45) Date of Patent: Mar. 5, 2024

(54) SEMICONDUCTOR PACKAGE AND METHOD FOR FABRICATING THE SAME

(71) Applicant: Samsung Electronics Co., Ltd., Suwon-si (KR)

(72) Inventor: Min Keun Kwak, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 112 days.

(21) Appl. No.: 17/382,872

(22) Filed: Jul. 22, 2021

(65) Prior Publication Data

US 2022/0165651 A1    May 26, 2022

(30) Foreign Application Priority Data

Nov. 25, 2020 (KR) .................. 10-2020-0159485

(51) Int. Cl.
| | | |
|---|---|---|
| *H01L 23/31* | (2006.01) | |
| *H01L 23/498* | (2006.01) | |
| *H01L 23/538* | (2006.01) | |
| *H01L 25/10* | (2006.01) | |

(52) U.S. Cl.
CPC .... *H01L 23/49833* (2013.01); *H01L 23/3128* (2013.01); *H01L 23/49838* (2013.01); *H01L 23/5389* (2013.01); *H01L 25/105* (2013.01); *H01L 2225/1058* (2013.01)

(58) Field of Classification Search
CPC ........... H01L 23/49833; H01L 23/3128; H01L 23/49838; H01L 23/5389; H01L 25/105
See application file for complete search history.

(56) References Cited

U.S. PATENT DOCUMENTS

| | | |
|---|---|---|
| 5,504,035 A | 4/1996 | Rostoker et al. |
| 5,530,288 A | 6/1996 | Stone |
| 7,331,796 B2 | 2/2008 | Hougham et al. |
| 8,426,961 B2 | 4/2013 | Shih et al. |
| 9,070,679 B2 | 6/2015 | Wu et al. |
| 9,299,650 B1 | 3/2016 | Chi et al. |
| 9,620,484 B2 | 4/2017 | Kim |
| 10,256,177 B2 | 4/2019 | Shen et al. |
| 10,453,785 B2 | 10/2019 | Shim et al. |
| 2013/0147026 A1 | 6/2013 | Topacio et al. |
| 2019/0115325 A1* | 4/2019 | Im ..................... H01L 23/49816 |

FOREIGN PATENT DOCUMENTS

| | | |
|---|---|---|
| JP | 4324773 B2 | 9/2009 |
| KR | 101653563 B1 | 9/2016 |

* cited by examiner

*Primary Examiner* — Trang Q Tran
(74) *Attorney, Agent, or Firm* — Harness, Dickey & Pierce, P.L.C.

(57) ABSTRACT

A semiconductor package including a first package substrate, a first semiconductor chip on a top surface of the first package substrate, an interposer electrically connected to the first package substrate on a top surface of the first semiconductor chip, and a molding layer configured to cover the first package substrate and the first semiconductor chip may be provided. The interposer may include an interposer trench recessed from a bottom surface of the interposer that faces both the top surface of the first semiconductor chip and the top surface of the first package substrate, and an interposer hole penetrating the interposer. The molding layer may include a filling portion filling a region between the first package substrate and the interposer, a through portion filling the interposer hole, and a cover portion covering at least a part of a top surface of the interposer.

18 Claims, 18 Drawing Sheets

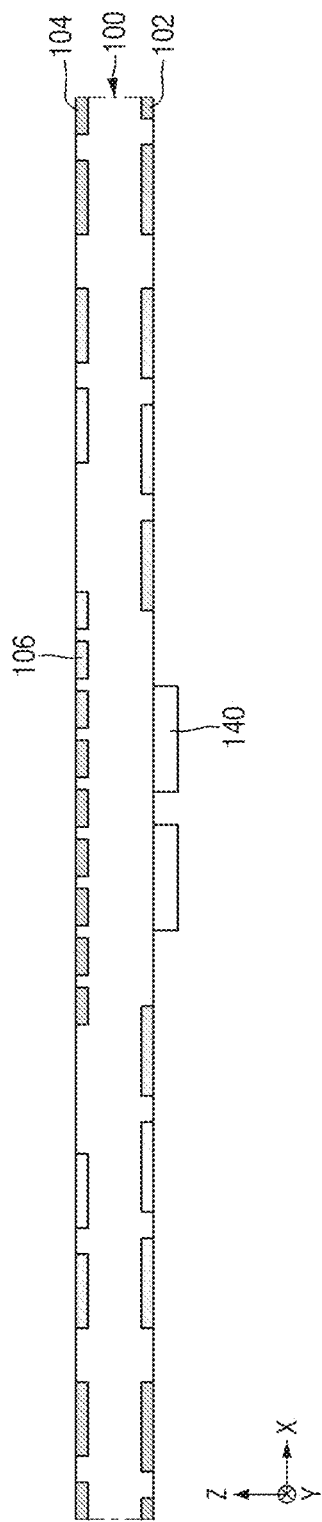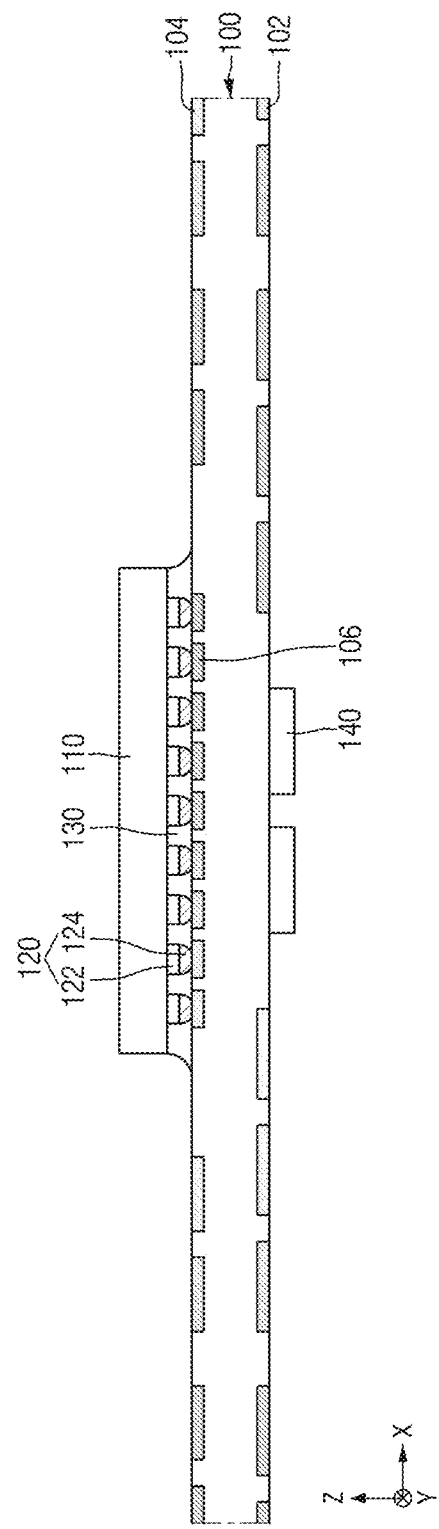

SEMICONDUCTOR PACKAGE AND METHOD FOR FABRICATING THE SAME

CROSS-REFERENCE TO RELATED APPLICATION

This application claims priority from Korean Patent Application No. 10-2020-0159485 filed on Nov. 25, 2020 in the Korean Intellectual Property Office, and all the benefits accruing therefrom under 35 U.S.C. 119, the contents of which in its entirety are herein incorporated by reference.

BACKGROUND

1. Technical Field

The present disclosure relates to semiconductor packages and methods for fabricating the same. More particularly, the present disclosure relates to package-on-package (POP) semiconductor packages and/or methods for fabricating the same.

2. Description of the Related Art

With the development of the electronic industry, the demand for high functionality, high speed and miniaturization of electronic components is increasing. In line with this trend, a method of stacking and mounting a plurality of semiconductor chips on one package substrate or stacking a package on a package may be used. For example, a package-in-package (PIP) semiconductor package or a package-on-package (POP) semiconductor package may be used.

The POP semiconductor package may include an interposer for electrical connection between an upper package and a lower package. The interposer may facilitate the connection between the upper package and the lower package, and prevent warpage of the upper package and the lower package.

SUMMARY

Some aspects of the present disclosure provide semiconductor packages with improved product reliability.

Some aspects of the present disclosure also provide methods for fabricating a semiconductor package with improved product reliability.

According to some aspects of the present disclosure, a semiconductor package may include a first package substrate, a first semiconductor chip on a top surface of the first package substrate, an interposer electrically connected to the first package substrate on a top surface of the first semiconductor chip and a molding layer configured to cover the first package substrate and the first semiconductor chip. The interposer may include an interposer trench recessed from a bottom surface of the interposer, the bottom surface of the interposer facing both the top surface of the first semiconductor chip and the top surface of the first package substrate, and an interposer hole penetrating the interposer. The molding layer may include a filling portion filling a region between the first package substrate and the interposer, a through portion filling the interposer hole, and a cover portion covering at least a part of a top surface of the interposer.

According to some aspects of the present disclosure, a semiconductor package may include a package substrate, a semiconductor chip on a top surface of the package substrate and an interposer on a top surface of the semiconductor chip, the interposer being spaced apart from the semiconductor chip and electrically connected to the package substrate. The interposer may include an interposer trench recessed from a bottom surface of the interposer and configured to overlap the semiconductor chip in plan view, the bottom surface of the interposer facing both the top surface of the semiconductor chip and the top surface of the package substrate, and an interposer hole extending from the interposer trench to penetrate the interposer, the interposer hole having a width smaller than that of the interposer trench.

According to some aspects of the present disclosure, a semiconductor package may include a first package substrate, a first semiconductor chip on a top surface of the first package substrate, a second package substrate on a top surface of the first semiconductor chip, a second semiconductor chip on a top surface of the second package substrate, an interposer spaced apart from the first semiconductor chip and between the first semiconductor chip and the second package substrate, a first connection member between the first package substrate and the interposer, the first connection member electrically connecting the first package substrate to the interposer, a molding layer on the top surface of the first package substrate, the molding layer covering the first package substrate and the first semiconductor chip and a second connection member between the interposer and the second package substrate, the second connection member electrically connecting the interposer to the second package substrate. The interposer may include an interposer trench recessed from a bottom surface of the interposer, the bottom surface of the interposer facing both the top surface of the first semiconductor chip and the top surface of the first package substrate, and an interposer hole penetrating the interposer, and the molding layer may fill the interposer trench and the interposer hole.

According to some aspects of the present disclosure, a method for fabricating a semiconductor package may include providing a first package substrate, mounting a first semiconductor chip on a top surface of the first package substrate, placing an interposer on a top surface of the first semiconductor chip, the interposer being electrically connected to the first package substrate, the interposer including an interposer trench recessed from a bottom surface of the interposer and an interposer hole penetrating the interposer, the bottom surface of the interposer facing both the top surface of the first semiconductor chip and the top surface of the first package substrate, and injecting a molding material between the first package substrate and the interposer to form a molding layer covering the first package substrate and the first semiconductor chip.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail some example embodiments thereof with reference to the attached drawings, in which:

FIGS. 13 to 17 are views illustrating intermediate steps of a method for fabricating a semiconductor package according to some example embodiments.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, semiconductor packages according to some example embodiments will be described with reference to FIGS. 1 to 12.

Figure 1:
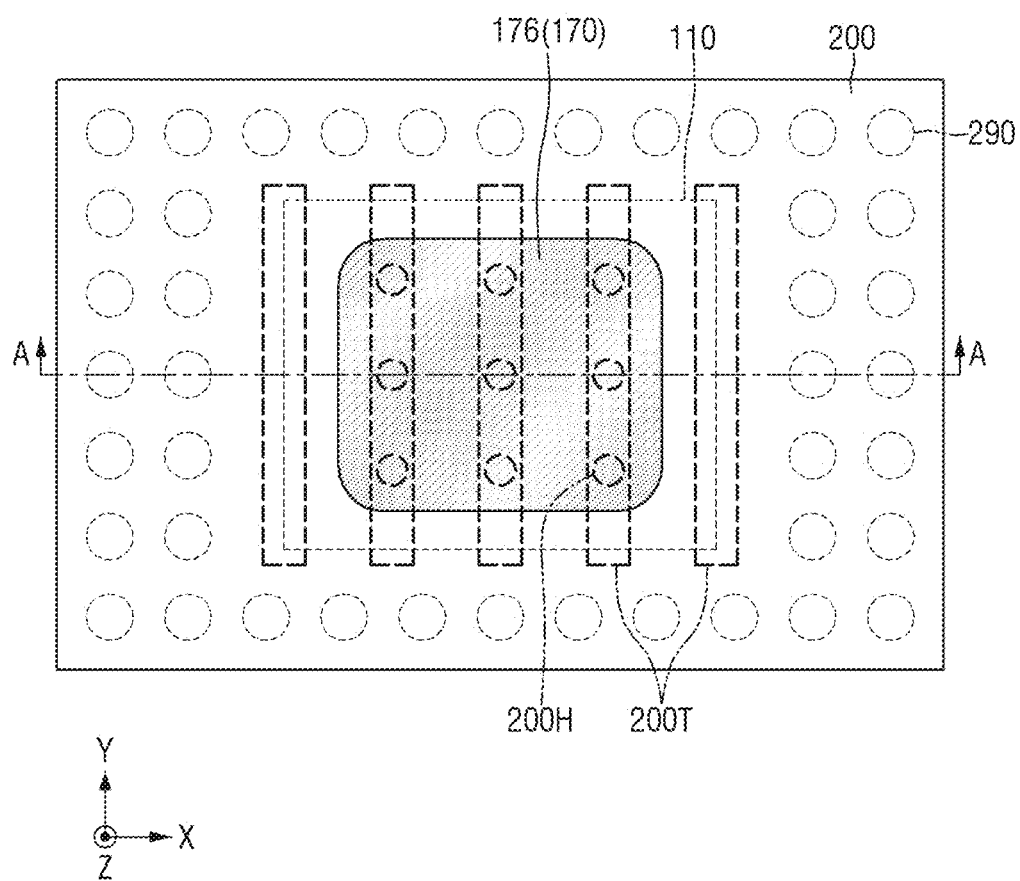
FIG. 1 is an example layout diagram illustrating a semiconductor package according to some example embodiments.
Figure 2:
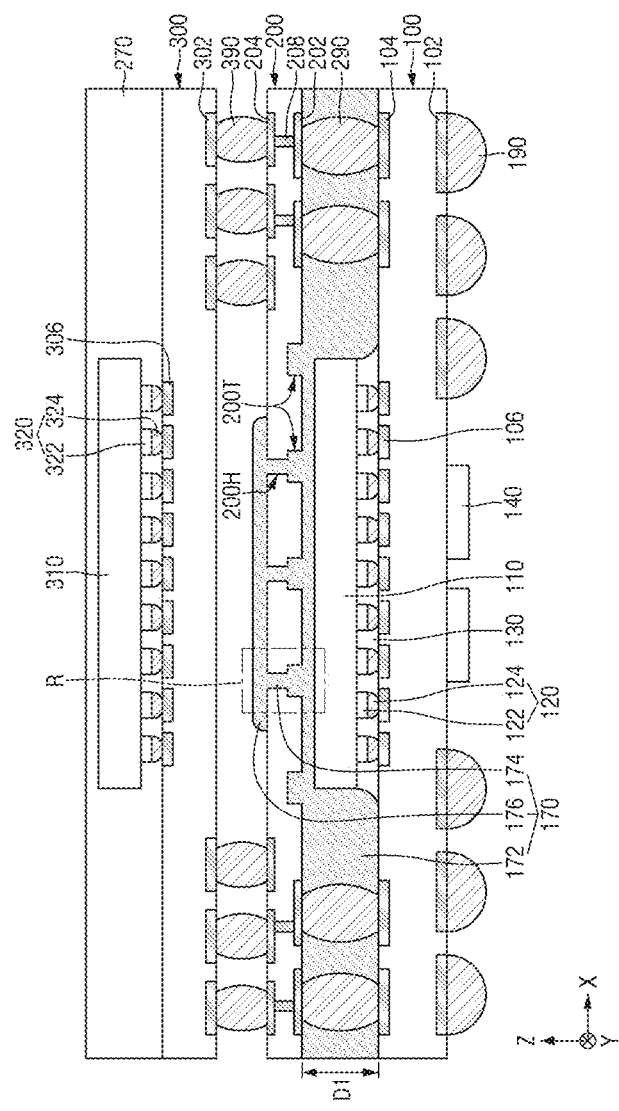
FIG. 2 is a schematic cross-sectional view taken along line A-A of FIG. 1.
Figure 3:
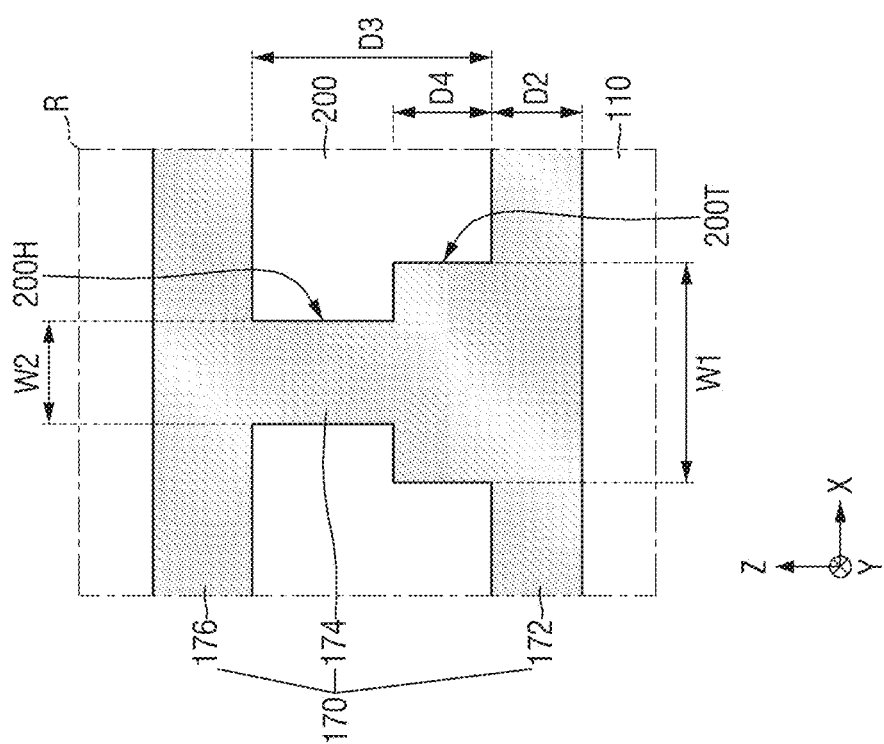
FIG. 3 is an enlarged view illustrating area R of FIG. 2.
Figure 4:
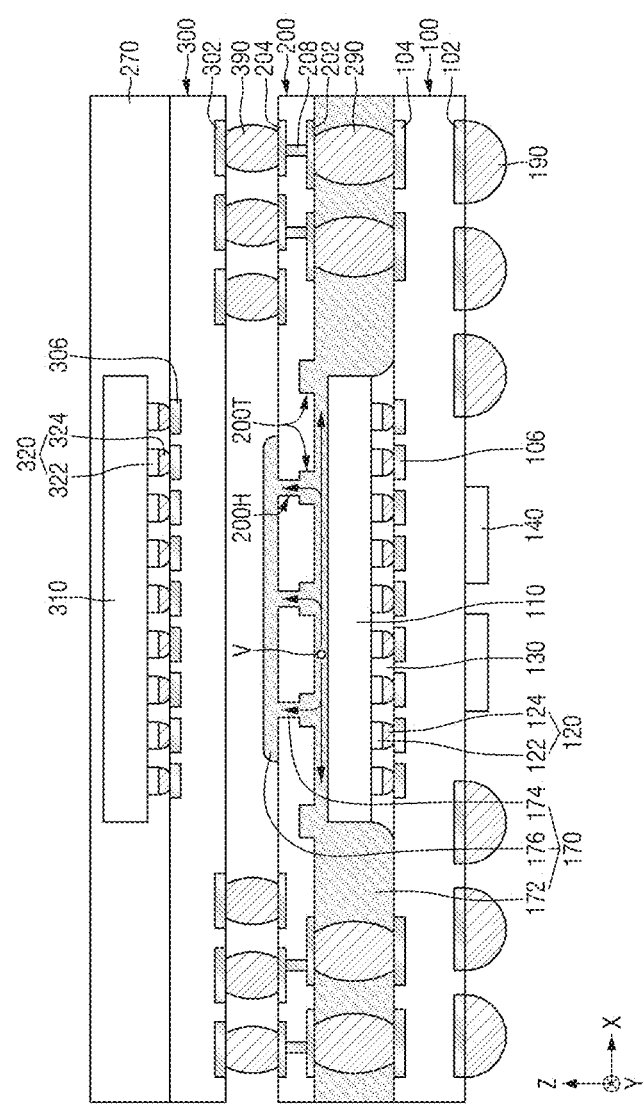
FIG. 4 is a schematic cross-sectional view for explaining an effect of a semiconductor device according to some example embodiments.

FIG. 1 is an example layout diagram illustrating a semiconductor package according to some example embodiments. FIG. 2 is a schematic cross-sectional view taken along line A-A of FIG. 1. FIG. 3 is an enlarged view illustrating area R of FIG. 2. FIG. 4 is a schematic cross-sectional view for explaining an effect of a semiconductor device according to some example embodiments.

Referring to FIGS. 1 to 4, a semiconductor package according to some example embodiments includes a first package substrate 100, a first semiconductor chip 110, an interposer 200, a first molding layer 170, a second package substrate 300, a second semiconductor chip 310, and a second molding layer 270.

The first package substrate 100 may be a substrate for a package. For example, the first package substrate 100 may be a printed circuit board (PCB), a ceramic substrate, or the like. In some example embodiments, the first package substrate 100 may also be a wafer level package (WLP) substrate fabricated at a wafer level. The first package substrate 100 may be configured as a single layer or multiple layers. The first package substrate 100 may include a bottom surface and a top surface opposite to each other.

The first package substrate 100 may include a first lower pad 102, a first upper pad 104, and a first chip pad 106. The first lower pad 102 may be exposed from the bottom surface of the first package substrate 100. Each of the first upper pad 104 and the first chip pad 106 may be exposed from the top surface of the first package substrate 100. Each of the first lower pad 102, the first upper pad 104 and the first chip pad 106 may be connected to an electrical circuit (e.g., a wiring pattern) formed in the first package substrate 100. That is, each of the first lower pad 102, the first upper pad 104, and the first chip pad 106 may be a portion (e.g., pattern or pad) through which the wiring pattern or the like of the first package substrate 100 is connected to the outside.

In some example embodiments, a first connection member 190 may be formed on the bottom surface of the first package substrate 100. The first connection member 190 may electrically connect the first package substrate 100 to an external device. For example, the first connection member 190 may contact the first lower pad 102 of the first package substrate 100. Accordingly, the first connection member 190 may provide an electrical signal of the external device to the first package substrate 100 or may provide an electrical signal of the first package substrate 100 to the external device.

The first connection member 190 may be, for example, a spherical, hemispherical, or elliptical spherical bump, but is not limited thereto. The first connection member 190 may include, for example, tin (Sn), indium (In), bismuth (Bi), antimony (Sb), copper (Cu), silver (Ag), zinc (Zn), lead (Pb), or a combination thereof, but the present disclosure is not limited thereto.

In some example embodiments, a circuit element 140 may be disposed on the first package substrate 100. The circuit element 140 is shown to be disposed on the bottom surface of the first package substrate 100, but this is merely an example. The circuit element 140 may include various active elements, such as transistors, or various passive elements, such as capacitors, resistors, and/or inductors. As one example, the circuit element 140 may be a capacitor.

The first semiconductor chip 110 may be mounted above the first package substrate 100. As one example, the first semiconductor chip 110 may be mounted above the top surface of the first package substrate 100. The first semiconductor chip 110 may be an integrated circuit (IC) chip having hundreds to millions of semiconductor elements integrated therein. For example, the first semiconductor chip 110 may be a memory chip such as a volatile memory (e.g., DRAM) or a nonvolatile memory (e.g., ROM or flash memory), an application processor (AP) chip such as a central processing unit (CPU), a graphic processing unit (GPU), a field-programmable gate array (FPGA), a digital signal processor, an encryption processor, a microprocessor, or a microcontroller, or a logic chip such as analog-digital converter (ADC) or an application-specific IC (ASIC), but is not limited thereto. Further, the first semiconductor chip 110 may be configured with a combination thereof.

In FIGS. 1 and 2, it is shown that only one first semiconductor chip 110 is mounted above the first package substrate 100, but this is merely an example. Unlike the illustrated example, a plurality of first semiconductor chips 110 may be mounted side by side above the first package substrate 100, or a plurality of first semiconductor chips 110 may be sequentially stacked above the first package substrate 100.

In some example embodiments, a first chip bump 120 may be formed between the first package substrate 100 and the first semiconductor chip 110. The first chip bump 120 may electrically connect the first package substrate 100 to the first semiconductor chip 110. For example, the first semiconductor chip 110 may be mounted above the first package substrate 100 by a flip chip bonding method. As one example, the first chip bump 120 may include a first pillar layer 122 and a first solder layer 124.

The first pillar layer 122 may have a columnar structure protruding from the bottom surface of the first semiconductor chip 110. Further, the first pillar layer 122 may be electrically connected to the first semiconductor chip 110. The first pillar layer 122 may include, for example, copper (Cu), a copper alloy, nickel (Ni), a nickel alloy, palladium (Pd), platinum (Pt), gold (Au), cobalt (Co), or a combination thereof, but the present disclosure is not limited thereto.

The first solder layer 124 may electrically connect the first pillar layer 122 to the first package substrate 100. For example, the first solder layer 124 may contact the first chip pad 106 of the first package substrate 100. The first solder layer 124 may be, for example, a spherical, hemispherical, or elliptical spherical structure. The first solder layer 124 may include, for example, tin (Sn), indium (In), bismuth (Bi), antimony (Sb), copper (Cu), silver (Ag), zinc (Zn), lead (Pb), or a combination thereof, but the present disclosure is not limited thereto.

In some example embodiments, an underfill 130 may be formed between the first package substrate 100 and the first semiconductor chip 110. The underfill 130 may fill a region between the first package substrate 100 and the first semiconductor chip 110. Further, the underfill 130 may cover the first chip bump 120. The first chip bump 120 may penetrate the underfill 130 to connect the first package substrate 100 to the first semiconductor chip 110.

The underfill 130 may mitigate or prevent cracking of the first semiconductor chip 110 by fixing the first semiconductor chip 110 to the first package substrate 100. The underfill 130, for example, may include an insulating polymer material such as an epoxy molding compound (EMC), but is not limited thereto.

In some example embodiments, the underfill 130 may include a material different from the first molding layer 170 to be described later. For example, the underfill 130 may include an insulating material having better fluidity than the first molding layer 170. Accordingly, the underfill 130 may efficiently fill a narrow space between the first package substrate 100 and the first semiconductor chip 110.

The interposer 200 may be disposed above the top surface of the first package substrate 100 and the top surface of the first semiconductor chip 110. Further, the interposer 200 may be interposed between the first package substrate 100 and the second package substrate 300 to be described later. The interposer 200 may facilitate connection between the first package substrate 100 and the second package substrate 300. Further, the interposer 200 may mitigate or prevent warpage of the first package substrate 100 and the second package substrate 300.

The interposer 200 may include a bottom surface and a top surface opposite to each other. For example, the bottom surface of the interposer 200 may face the top surface of the first package substrate 100, and the top surface of the interposer 200 may face the bottom surface of the second package substrate 300.

The interposer 200 may include a second lower pad 202 and a second upper pad 204. The second lower pad 202 may be exposed from the bottom surface of the interposer 200. The second upper pad 204 may be exposed from the top surface of the interposer 200. Each of the second lower pad 202 and the second upper pad 204 may be connected to an electrical circuit (e.g., a wiring pattern) formed in the interposer 200. That is, each of the second lower pad 202 and the second upper pad 204 may be a portion (e.g., pattern or pad) through which the wiring pattern or the like of the interposer 200 is connected to the outside.

In some example embodiments, the interposer 200 may further include a through via 208. The through via 208 may penetrate the interposer 200. For example, the through via 208 may extend in a first direction Z intersecting with the top surface of the interposer 200 to penetrate the interposer 200. The through via 208 penetrating the interposer 200 may electrically connect the second lower pad 202 to the second upper pad 204.

The interposer 200 may be electrically connected to the first package substrate 100. For example, a second connection member 290 may be formed between the first package substrate 100 and the interposer 200. The second connection member 290 may electrically connect the first package substrate 100 to the interposer 200. For example, the second connection member 290 may contact the first upper pad 104 of the first package substrate 100 and the second lower pad 202 of the interposer 200.

The second connection member 290 may be, for example, a spherical, hemispherical, or elliptical spherical bump, but is not limited thereto. The second connection member 290 may include, for example, tin (Sn), indium (In), bismuth (Bi), antimony (Sb), copper (Cu), silver (Ag), zinc (Zn), lead (Pb), or a combination thereof, but the present disclosure is not limited thereto.

In some example embodiments, the second connection member 290 may be disposed to the side of the first semiconductor chip 110. For example, as shown in FIG. 1, a plurality of second connection members 290 may be disposed to surround the first semiconductor chip 110 in plan view.

The interposer 200 may be spaced apart from the first package substrate 100. For example, a separation distance D1 between the first package substrate 100 and the interposer 200 may be about 100 μm to about 200 μm. For example, the separation distance D1 between the first package substrate 100 and the interposer 200 may be about 130 μm to about 190 μm.

In some example embodiments, the interposer 200 may be spaced apart from the first semiconductor chip 110. For example, as shown in FIG. 2, with respect to the top surface of the first package substrate 100, the top surface of the second connection member 290 may be positioned higher than the top surface of the first semiconductor chip 110. For example, a separation distance D2 between the first semiconductor chip 110 and the interposer 200 may be about 5 μm to about 100 μm. For example, the separation distance D2 between the first semiconductor chip 110 and the interposer 200 may be about 10 μm to about 50 μm.

The interposer 200 may include an interposer trench 200T and an interposer hole 200H.

The interposer trench 200T may be formed by being recessed from the bottom surface of the interposer 200 that faces both the top surface of the first semiconductor chip 110 and the top surface of the first package substrate 100. For example, the interposer trench 200T may be recessed from the bottom surface of the interposer 200 in the first direction Z.

In some example embodiments, the depth of the interposer trench 200T may be smaller than the thickness of the interposer 200. Here, the depth or thickness means a depth or thickness in a direction (e.g., the first direction Z) intersecting with the bottom surface of the interposer 200. For example, as shown in FIG. 3, a thickness D3 of the interposer 200 in the first direction Z may be greater than a depth D4 of the interposer trench 200T in the first direction Z. Accordingly, the interposer trench 200T may not be exposed from the top surface of the interposer 200.

The thickness D3 of the interposer 200 may be, for example, about 50 μm to about 200 μm. For example, the thickness D3 of the interposer 200 may be about 70 μm to about 120 μm.

The depth D4 of the interposer trench 200T may be, for example, about 10 μm to about 100 μm. When the depth D4 of the interposer trench 200T is smaller than about 10 μm, during a process of injecting a molding material to form the first molding layer 170 to be described later, the fluidity of the molding material may decrease. When the depth D4 of the interposer trench 200T is greater than about 100 μm, the strength of the interposer 200 may decrease, and thus warpage may be severe and handling may be difficult. Thus, for example, the depth D4 of the interposer trench 200T may be about 30 μm to about 50 μm.

In some example embodiments, the interposer trench 200T may elongate along a second direction Y parallel to the bottom surface of the interposer 200. For example, as shown in FIG. 1, the interposer trench 200T may include long sides extending in the second direction Y and short sides extending in a third direction X parallel to the bottom surface of the interposer 200 and intersecting with the second direction Y.

In some example embodiments, the interposer 200 may include a plurality of interposer trenches 200T spaced apart from each other. The plurality of interposer trenches 200T may be arranged, for example, along the third direction X.

The interposer hole 200H may be formed to penetrate the interposer 200. For example, the interposer hole 200H may extend in the first direction Z to penetrate the interposer 200. The interposer hole 200H may be exposed from the top surface of the interposer 200.

In some example embodiments, the interposer 200 may include a plurality of interposer holes 200H spaced apart from each other. The plurality of interposer holes 200H may be two-dimensionally arranged on a plane including, for example, the second direction Y and the third direction X. In FIG. 1, nine interposer holes 200H are arranged in a lattice form, but this is merely an example, and the arrangement or number of the interposer holes 200H may vary. Further, each interposer hole 200H is shown to have a cylindrical shape, but this is merely an example, and each interposer hole 200H may have various other shapes such as a polygonal column or the like.

At least a part of the interposer trench 200T and at least a part of the interposer hole 200H may each overlap the first semiconductor chip 110. In the present disclosure, overlapping means overlapping in plan view. For example, the interposer hole 200H and a part of the interposer trench 200T may each overlap the first semiconductor chip 110 in the first direction Z.

In some example embodiments, at least a part of the interposer trench 200T may overlap the edge of the first semiconductor chip 110. For example, a part of the interposer trench 200T may overlap the edge of the first semiconductor chip 110 extending in the second direction Y. Further, another part of the interposer trench 200T may overlap a part of the edge of the first semiconductor chip 110 extending in the third direction X.

In some example embodiments, at least some of the plurality of interposer holes 200H may overlap the interposer trench 200T. For example, as shown in FIG. 2, the interposer hole 200H may extend from the interposer trench 200T to penetrate the interposer 200.

In some example embodiments, the width of the interposer hole 200H may be smaller than the width of the interposer trench 200T. Here, the width means a width in a direction (e.g., the third direction X) parallel to the bottom surface of the interposer 200. For example, as shown in FIG. 3, the interposer trench 200T may have a first width W1 in the third direction X, and the interposer hole 200H may have a second width W2 in the third direction X. In this case, the second width W2 of the interposer hole 200H may be smaller than the first width W1 of the interposer trench 200T.

The first width W1 of the interposer trench 200T may be, for example, about 100 μm to about 300 μm in a direction crossing an extension direction of the interposer trench 200T. When the first width W1 of the interposer trench 200T is smaller than about 100 μm, during a process of injecting a molding material to form the first molding layer 170 to be described later, the fluidity of the molding material may decrease. When the first width W1 of the interposer trench 200T is greater than about 300 μm, the strength of the interposer 200 decreases and thus warpage may be severe and handling may be difficult. Thus, for example, the first width W1 of the interposer trench 200T may be about 150 μm to about 250 μm.

The second width W2 of the interposer hole 200H may be, for example, about 50 μm to about 150 μm. When the second width W2 of the interposer hole 200H is smaller than about 50 μm, voids that may occur in the first molding layer 170 may not be easily discharged. When the second width W2 of the interposer hole 200H is greater than about 150 μm, the strength of the interposer 200 decreases, and thus warpage may be severe and handling may be difficult. Thus, for example, the second width W2 of the interposer hole 200H may be about 70 μm to about 130 μm.

The first molding layer 170 may be disposed on the top surface of the first package substrate 100. The first molding layer 170 may cover the first package substrate 100, the first semiconductor chip 110, and the second connection member 290. The first molding layer 170 may fill a region between the first package substrate 100 and the interposer 200. For example, the second connection member 290 may penetrate the first molding layer 170 to connect the first package substrate 100 to the interposer 200. The first molding layer 170 may include, for example, an insulating polymer material such as an epoxy molding compound (EMC), but is not limited thereto.

In some example embodiments, the first molding layer 170 may include a filling portion 172, a through portion 174, and a cover portion 176. The filling portion 172, the through portion 174, and the cover portion 176 may be integrally formed.

The filling portion 172 may cover the first package substrate 100, the first semiconductor chip 110, and the second connection member 290. For example, the filling portion 172 may cover the top surface of the first package substrate 100, the top and side surfaces of the first semiconductor chip 110, and the side surface of the second connection member 290. The filling portion 172 may fill the region between the first package substrate 100 and the interposer 200. Because the interposer 200 may be spaced apart from the first semiconductor chip 110, the filling portion 172 may fill a region between the first semiconductor chip 110 and the interposer 200. Further, the filling portion 172 may fill the interposer trench 200T.

The through portion 174 may extend from the filling portion 172. The through portion 174 may fill the interposer hole 200H. That is, the through portion 174 may be a part of the first molding layer 170 penetrating the interposer 200. In some example embodiments, because the interposer 200 may include the plurality of interposer holes 200H spaced apart from each other, the first molding layer 170 may include a plurality of through portions 174 spaced apart from each other.

The cover portion 176 may extend from the through portion 174. For example, the through portion 174 may connect the filling portion 172 to the cover portion 176. The cover portion 176 may cover at least a part of the top surface of the interposer 200. That is, the cover portion 176 may be a part of the first molding layer 170 disposed on the top surface of the interposer 200. In some example embodiments, at least a part of the cover portion 176 may overlap the first semiconductor chip 110 in plan view.

In some example embodiments, the cover portion 176 may connect the plurality of through portions 174, which are spaced apart from each other, to each other. For example, as shown, the cover portion 176 may be formed in a plate shape crossing the first direction Z to connect the plurality of through portions 174 spaced apart from each other. The cover portion 176 formed in a plate shape may firmly support the interposer 200 to improve strength. Further, the cover portion 176 formed in a plate shape may provide a space for product marking to improve product identification.

The second package substrate 300 may be disposed above the top surface of the interposer 200. The second package substrate 300 may be a substrate for a package. For example, the second package substrate 300 may be a printed circuit board (PCB), a ceramic substrate, or the like. In some example embodiments, the second package substrate 300 may also be a wafer level package (WLP) substrate fabricated at a wafer level. The second package substrate 300 may be configured as a single layer or multiple layers. The second package substrate 300 may include a bottom surface and a top surface opposite to each other. For example, the bottom surface of the second package substrate 300 may face the top surface of the interposer 200.

The second package substrate 300 may include a third lower pad 302 and a second chip pad 306. The third lower pad 302 may be exposed from the bottom surface of the second package substrate 300. The second chip pad 306 may be exposed from the top surface of the second package substrate 300. Each of the third lower pad 302 and the second chip pad 306 may be connected to an electrical circuit (e.g., a wiring pattern), formed in the second package substrate 300. That is, each of the third lower pad 302 and the second chip pad 306 may be a portion (pattern or pad) through which the wiring pattern or the like of the second package substrate 300 is connected to the outside.

The second package substrate 300 may be electrically connected to the interposer 200. For example, a third connection member 390 may be formed between the interposer 200 and the second package substrate 300. The third connection member 390 may electrically connect the interposer 200 to the second package substrate 300. For example, the third connection member 390 may contact the second upper pad 204 of the interposer 200 and the third lower pad 302 of the second package substrate 300.

The third connection member 390 may be, for example, a spherical, hemispherical, or elliptical spherical bump, but is not limited thereto. The third connection member 390 may include, for example, tin (Sn), indium (In), bismuth (Bi), antimony (Sb), copper (Cu), silver (Ag), zinc (Zn), lead (Pb), or a combination thereof, but the present disclosure is not limited thereto.

In some example embodiments, the second package substrate 300 may be spaced apart from the interposer 200. For example, as shown in FIG. 2, with respect to the top surface of the interposer 200, the top surface of the third connection member 390 may be positioned higher than the top surface of the cover portion 176 of the first molding layer 170.

The second semiconductor chip 310 may be mounted above the second package substrate 300. For example, the second semiconductor chip 310 may be mounted above the top surface of the second package substrate 300 that faces the top surface of the interposer 200. The second semiconductor chip 310 may be an integrated circuit (IC) having hundreds to millions of semiconductor elements integrated therein. For example, the second semiconductor chip 310 may be a memory chip such as a volatile memory (e.g., DRAM) or a nonvolatile memory (e.g., ROM or flash memory), an application processor (AP) chip such as a central processing unit (CPU), a field-programmable gate array (FPGA), a digital signal processor, an encryption processor, a microprocessor, or a microcontroller, or a logic chip such as analog-digital converter (ADC) or an application-specific IC (ASIC), but is not limited thereto. Further, the second semiconductor chip 310 may be configured with a combination thereof.

In some example embodiments, the first semiconductor chip 110 may be an application processor chip, and the second semiconductor chip 310 may be a memory chip.

In FIGS. 1 and 2, it is shown that only one second semiconductor chip 310 is mounted above the second package substrate 300, but this is merely an example. Unlike the illustrated example, a plurality of second semiconductor chips 310 may be mounted side by side above the second package substrate 300, or a plurality of second semiconductor chips 310 may be sequentially stacked above the second package substrate 300.

In some example embodiments, a second chip bump 320 may be formed between the second package substrate 300 and the second semiconductor chip 310. The second chip bump 320 may electrically connect the second package substrate 300 to the second semiconductor chip 310. For example, the second semiconductor chip 310 may be mounted above the second package substrate 300 by a flip chip bonding method. As one example, the second chip bump 320 may include a second pillar layer 322 and a second solder layer 324. Because the second pillar layer 322 may be similar to the first pillar layer 122 and the second solder layer 324 may be similar to the first solder layer 124, a detailed description thereof will be omitted below.

The second molding layer 270 may be disposed on the top surface of the second package substrate 300. The second molding layer 270 may cover the second package substrate 300 and the second semiconductor chip 310. For example, the second molding layer 270 may cover the top surface of the second package substrate 300 and the top and side surfaces of the second semiconductor chip 310. The second molding layer 270 may include, for example, an insulating polymer material such as EMC, but is not limited thereto. The second molding layer 270 may include the same material as the first molding layer 170 or may include a different material from the first molding layer 170.

As electronic devices are increasingly highly integrated, a miniaturized semiconductor package is desired. However, miniaturization of the semiconductor package causes various problems in its fabricating process. For example, in a POP package including the interposer, as a space between the interposer and a lower semiconductor chip (e.g., the first semiconductor chip 110) becomes narrower, a molding material may not be efficiently injected. This causes voids to occur in the molding layer formed of the molding material, thereby reducing product reliability. As one example, the voids formed in the molding layer may expand in a hightemperature process or move to cause a crack in the connection member (e.g., the second connection member 290) or the like.

However, the semiconductor package according to some example embodiments may suppress the occurrence of voids in the first molding layer 170 by including the interposer trench 200T. As described above, the interposer trench 200T may be recessed from the bottom surface of the interposer 200, and thus an additional space may be secured between the first semiconductor chip 110 and the interposer 200. This may improve the fluidity of the molding material injected between the first package substrate 100 and the interposer 200 and between the first semiconductor chip 110 and the interposer 200 in a process of forming the first molding layer 170. Accordingly, the occurrence of voids in the first molding layer 170 may be suppressed, thereby providing the semiconductor package with improved product reliability.

Further, the semiconductor package according to some example embodiments may easily discharge voids that may occur in the first molding layer 170 by including the interposer hole 200H. For example, as illustrated in FIG. 4, a void V may occur in the first molding layer 170. However, because the first molding layer 170 may have the through portion 174 penetrating the interposer 200, the void V may be easily discharged to the outside through the through portion 174 and/or the cover portion 176. Accordingly, a crack of the connection member (e.g., the second connection member 290) or the like may be mitigated or prevented, thereby providing the semiconductor package with improved product reliability.

FIGS. 5 to 8 are various schematic cross-sectional views illustrating a semiconductor package according to some example embodiments. For simplicity of description, redundant parts of the description made with reference to FIGS. 1 to 4 may be recapitulated or omitted.

Figure 5:
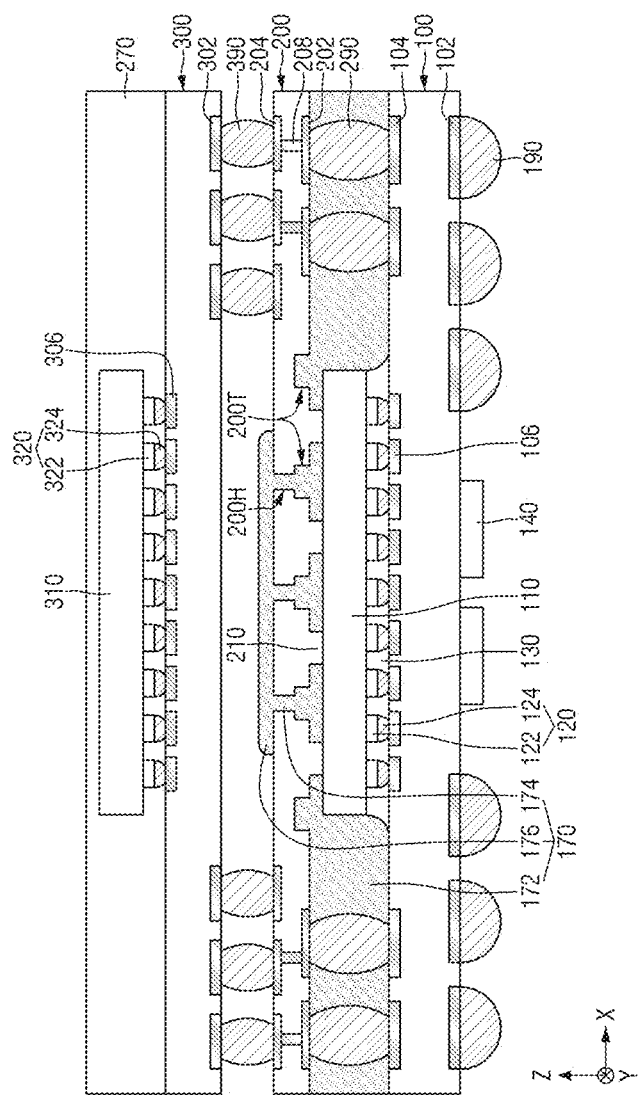
FIGS. 5 to 8 are various schematic cross-sectional views illustrating a semiconductor package according to some example embodiments.

Referring to FIG. 5, in the semiconductor package according to some example embodiments, the interposer 200 includes a support part 210.

The support part 210 may protrude from the bottom surface of the interposer 200. For example, the support part 210 may be a columnar structure protruding from the bottom surface of the interposer 200. The support part 210 may support the interposer 200 disposed on the first semiconductor chip 110. For example, the support part 210 may contact the top surface of the first semiconductor chip 110. Accordingly, warpage of the interposer 200 may be improved.

In some example embodiments, a plurality of support parts 210 may protrude from the bottom surface of the interposer 200. In FIG. 5, it is only shown that four support parts 210 are arranged at equal intervals along the third direction X, but this is merely an example, and the arrangement or number of the support parts 210 may vary. Further, in FIG. 5, it is only shown that all of the plurality of support parts 210 are in contact with the top surface of the first semiconductor chip 110, but this is merely an example. As another example, depending on the size of the second connection member 290, at least some of the plurality of support parts 210 may be spaced apart from the first semiconductor chip 110.

Figure 6:
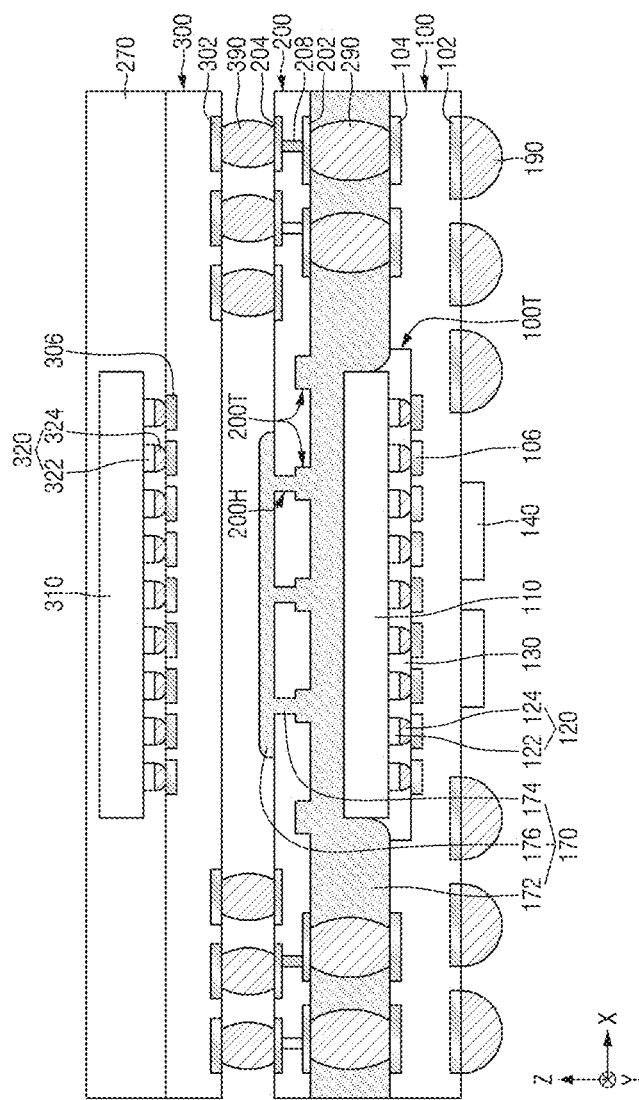

Referring to FIG. 6, in the semiconductor package according to some example embodiments, the first package substrate 100 includes a substrate trench 100T.

The substrate trench 100T may be formed by being recessed from the top surface of the first package substrate 100. For example, the bottom surface of the substrate trench 100T may be lower than the uppermost surface of the first package substrate 100.

In some example embodiments, the first semiconductor chip 110 may be mounted above the bottom surface of the substrate trench 100T. For example, the first chip pad 106 may be exposed from the bottom surface of the substrate trench 100T. Further, the first chip bump 120 may electrically connect the first chip pad 106 to the first semiconductor chip 110. In this case, as shown, an additional space may be secured between the first semiconductor chip 110 and the interposer 200 to improve the fluidity of the molding material injected between the first semiconductor chip 110 and the interposer 200. Thus, the semiconductor package with improved product reliability can be provided. In some other example embodiments, unlike the illustrated example, a separation distance between the first semiconductor chip 110 and the interposer 200 may be maintained or reduced. Due to this, a further miniaturized semiconductor package may be provided.

Figure 7:
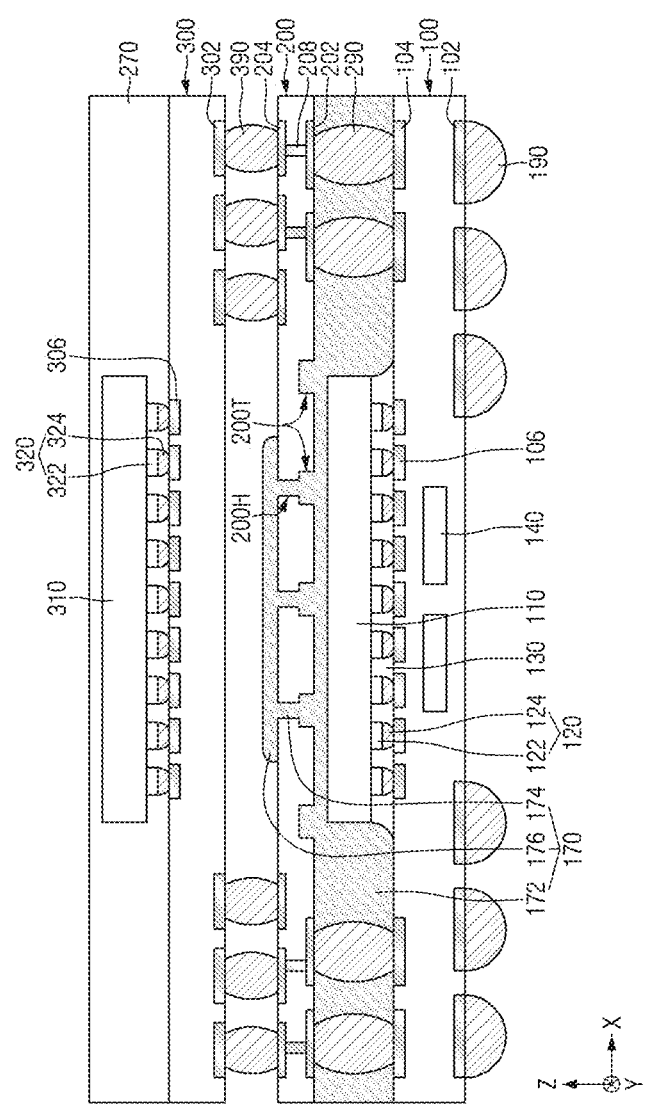

Referring to FIG. 7, in the semiconductor package according to some example embodiments, the circuit element 140 is disposed in the first package substrate 100.

For example, the circuit element 140 may be disposed in a region between the first lower pad 102 and the first upper pad 104 and/or a region between the first lower pad 102 and the first chip pad 106.

Figure 8:
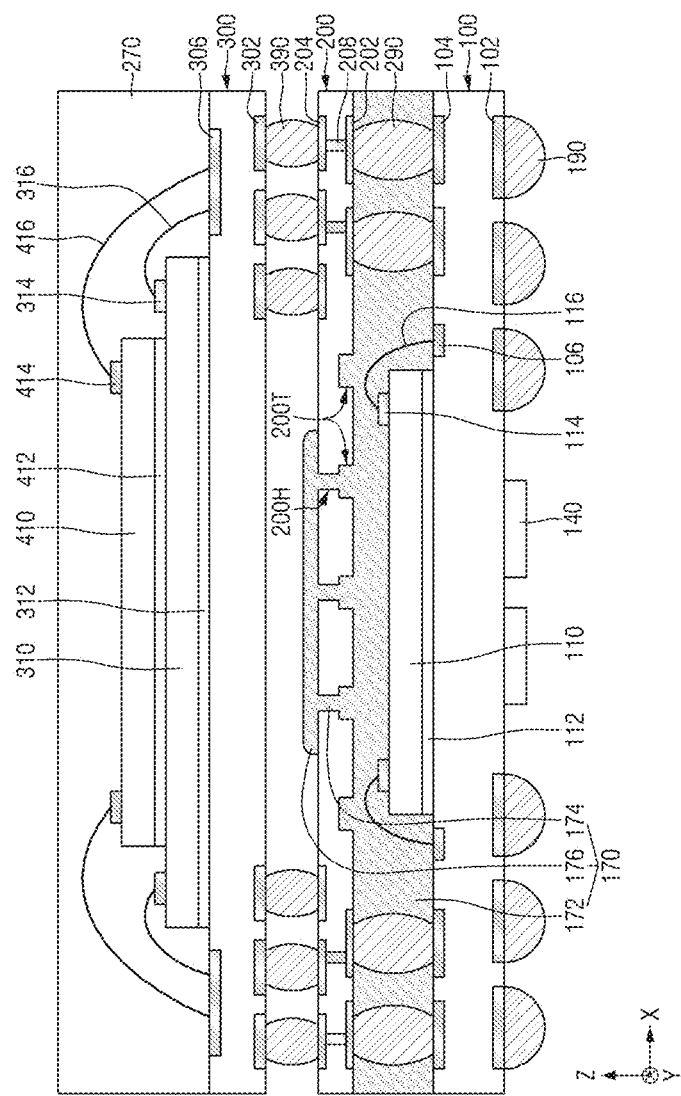

Referring to FIG. 8, in the semiconductor package according to some example embodiments, the first semiconductor chip 110 is mounted above the first package substrate 100 by a wire bonding method.

For example, a first attachment layer 112 may be formed between the first package substrate 100 and the first semiconductor chip 110. The first attachment layer 112 may attach the bottom surface of the first semiconductor chip 110 to the top surface of the first package substrate 100 by using an adhesive means. The first attachment layer 112 may include, for example, a liquid epoxy, an adhesive tape, a conductive medium, or a combination thereof, but is not limited thereto.

Further, a first bonding wire 116 may electrically connect the first package substrate 100 to the first semiconductor chip 110. For example, a first bonding pad 114 may be formed on the top surface of the first semiconductor chip 110. The first bonding wire 116 may electrically connect the first bonding pad 114 to the first chip pad 106.

In some example embodiments, the second semiconductor chip 310 may be mounted above the second package substrate 300 by a wire bonding method. For example, a second attachment layer 312 may be formed between the second package substrate 300 and the second semiconductor chip 310. Because the second attachment layer 312 may be similar to the first attachment layer 112, a detailed description thereof will be omitted below.

Further, a second bonding wire 316 may electrically connect the second package substrate 300 to the second semiconductor chip 310. For example, a second bonding pad 314 may be formed on the top surface of the second semiconductor chip 310. The second bonding wire 316 may electrically connect the second bonding pad 314 to the second chip pad 306.

In some example embodiments, a plurality of semiconductor chips may be stacked above the first package substrate 100 or the second package substrate 300. For example, a third semiconductor chip 410 may be stacked above the second semiconductor chip 310. For example, a third attachment layer 412 may be formed between the second semiconductor chip 310 and the third semiconductor chip 410. Because the third attachment layer 412 may be similar to the first attachment layer 112 or the second attachment layer 312, a detailed description thereof will be omitted below.

Further, a third bonding wire 416 may be formed to electrically connect the second package substrate 300 to the third semiconductor chip 410. For example, a third bonding pad 414 may be formed on the top surface of the third semiconductor chip 410. The third bonding wire 416 may electrically connect the third bonding pad 414 to the second chip pad 306.

Figure 9:
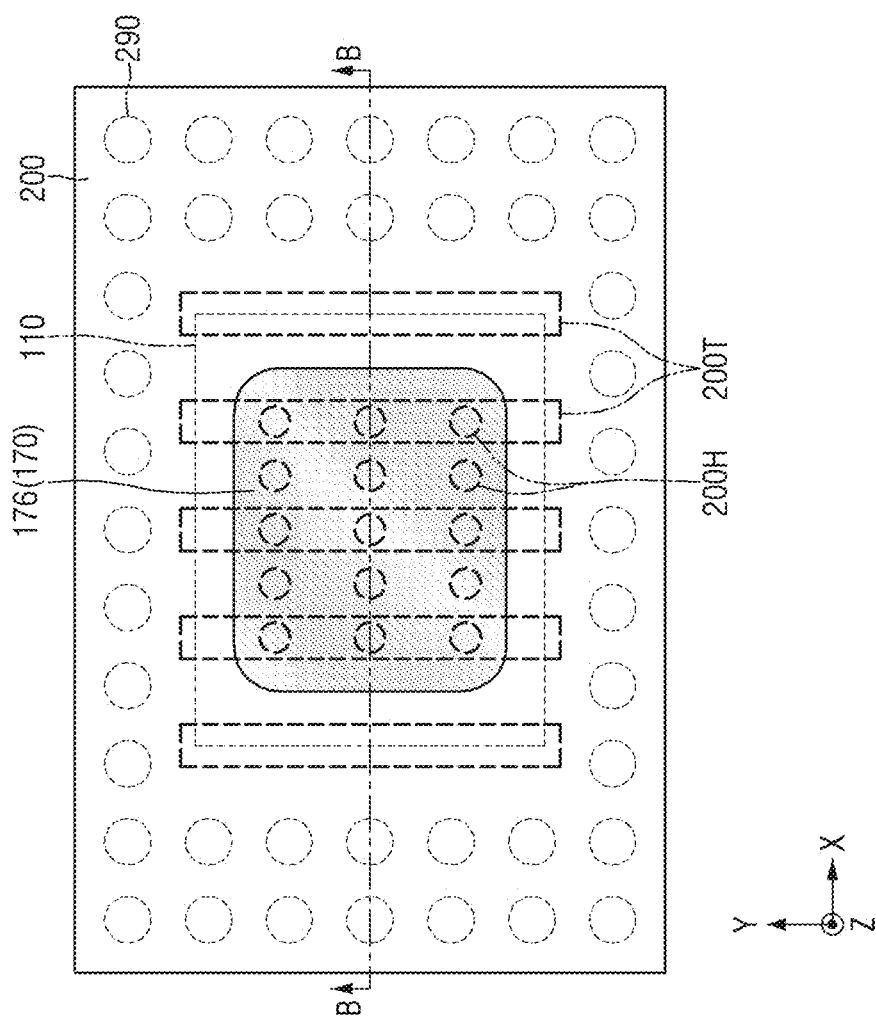
FIG. 9 is an example layout diagram illustrating a semiconductor package according to some example embodiments.
Figure 10:
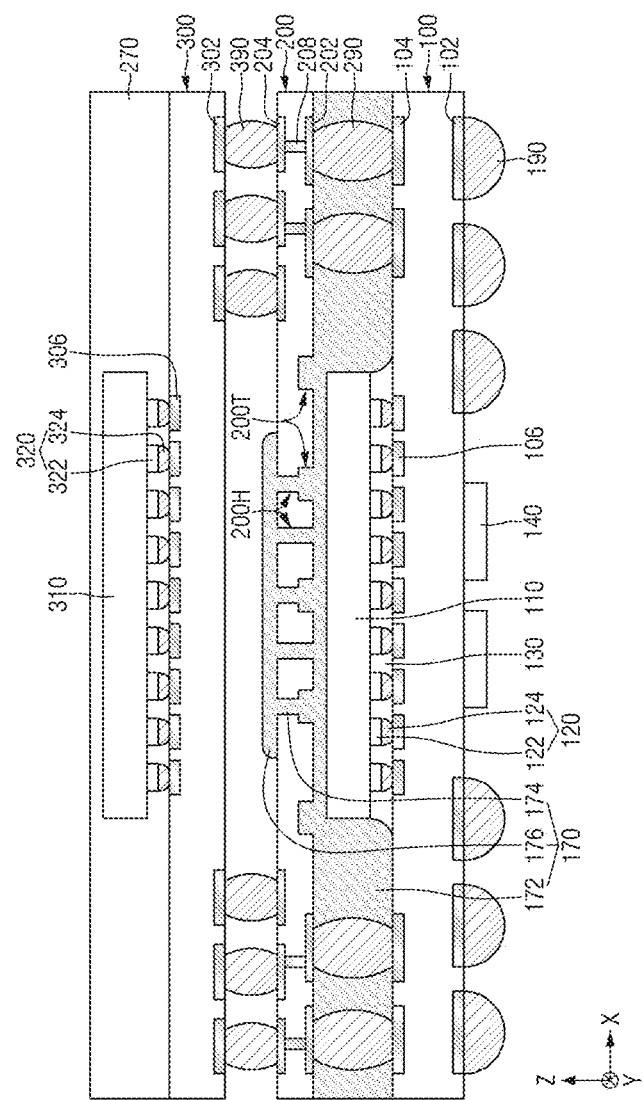
FIG. 10 is a schematic cross-sectional view taken along line B-B of FIG. 9.

FIG. 9 is an example layout diagram illustrating a semiconductor package according to some example embodiments. FIG. 10 is a schematic cross-sectional view taken along line B-B of FIG. 9. For simplicity of description, redundant parts of the description made with reference to FIGS. 1 to 4 may be recapitulated or omitted.

Referring to FIGS. 9 and 10, in the semiconductor package according to some example embodiments, at least some of the plurality of interposer holes 200H do not overlap the interposer trench 200T.

For example, as shown, some of the plurality of interposer holes 200H may be disposed inside the interposer trench 200T, and some others of the plurality of interposer holes 200H may be spaced apart from the interposer trench 200T.

The interposer hole 200H overlapping the interposer trench 200T may extend from the interposer trench 200T to penetrate the interposer 200. The interposer hole 200H that does not overlap the interposer trench 200T may extend from the bottom surface of the interposer 200 to the top surface of the interposer 200 to penetrate the interposer 200.

Although it is only shown that five interposer holes 200H are arranged at equal intervals along the third direction X, this is merely an example, and the arrangement or number of the interposer holes 200H may vary.

Figure 11:
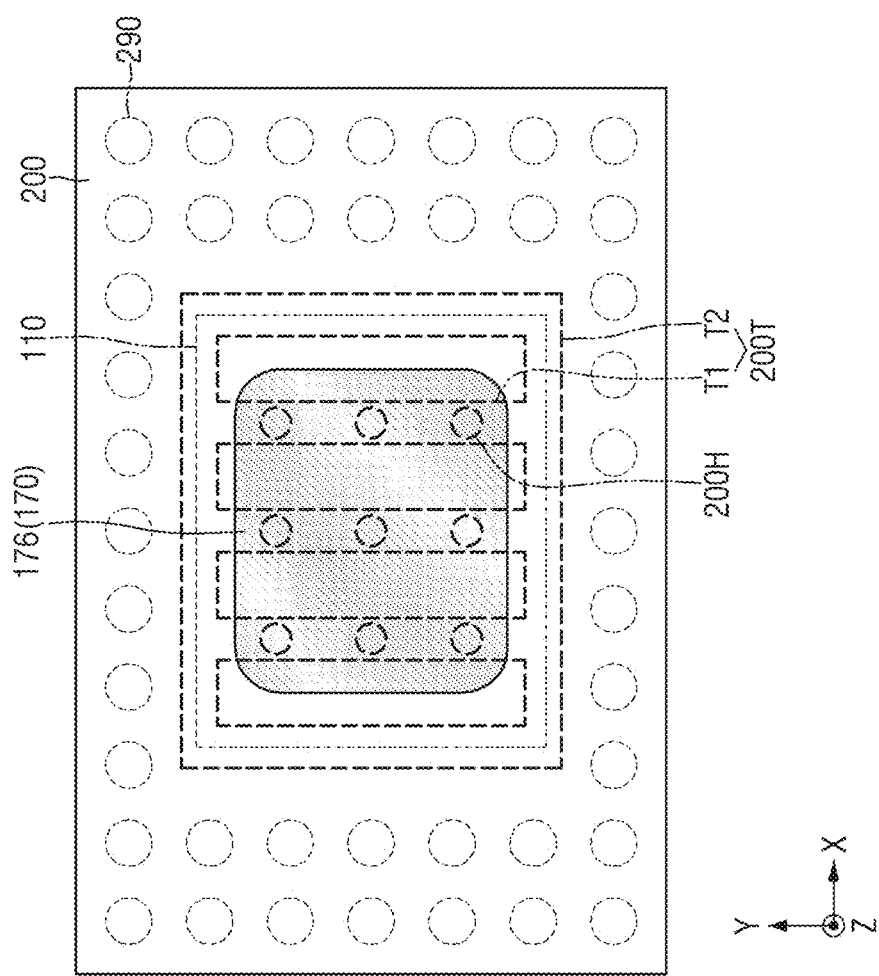
FIGS. 11 and 12 are various example layout diagrams illustrating a semiconductor package according to some example embodiments.
Figure 12:
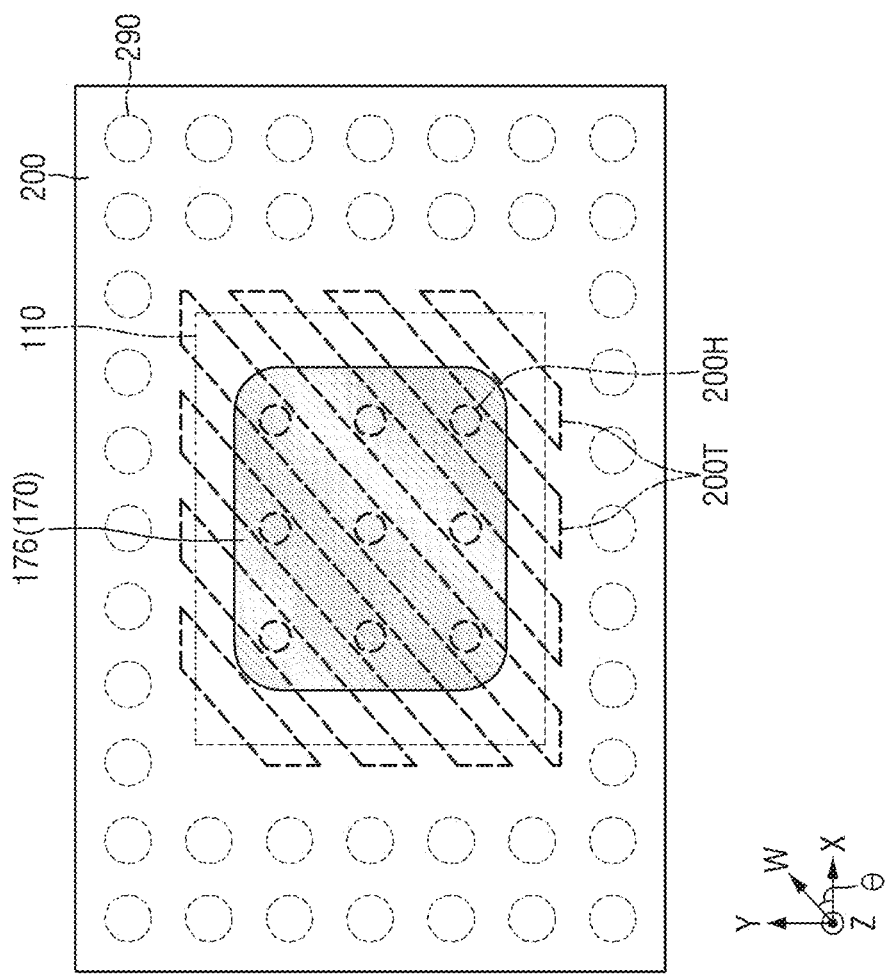

FIGS. 11 and 12 are various example layout diagrams illustrating a semiconductor package according to some example embodiments. For simplicity of description, redundant parts of the description made with reference to FIGS. 1 to 4 may be recapitulated or omitted.

Referring to FIG. 11, in the semiconductor package according to some example embodiments, the interposer trench 200T includes a first sub-trench T1 and a second sub-trench T2.

The first sub-trench T1 and the second sub-trench T2 may cross each other. For example, the first sub-trench T1 may be elongated along the second direction Y, and the second sub-trench T2 may be elongated along the third direction X.

In some example embodiments, at least a part of the first sub-trench T1 may overlap the edge of the first semiconductor chip 110 extending in the second direction Y, and at least a part of the second sub-trench T2 may overlap the edge of the first semiconductor chip 110 extending in the third direction X.

Only the interposer holes 200H overlapping the first sub-trench T1 are shown, but this is merely an example, and at least some of the interposer holes 200H may overlap the second sub-trench T2.

Referring to FIG. 12, in the semiconductor package according to some example embodiments, the interposer trench 200T is parallel to the bottom surface of the interposer 200 and is elongated along a fourth direction W different from the second direction Y and the third direction X.

For example, the fourth direction W may form an acute angle θ with the third direction X. The acute angle θ may be greater than 0° and smaller than 90°. The acute angle θ may vary depending on the direction in which the molding material is injected to form the first molding layer 170.

Hereinafter, a method for fabricating a semiconductor package according to some example embodiments will be described with reference to FIGS. 1 to 4 and 13 to 19.

FIGS. 13 to 17 are views illustrating intermediate steps of a method for fabricating a semiconductor package according to some example embodiments. For simplicity of description, redundant parts of the description made with reference to FIGS. 1 to 4 may be recapitulated or omitted.

Referring to FIG. 13, the first package substrate 100 is provided.

The first package substrate 100 may be, for example, a printed circuit board (PCB), a ceramic substrate, or the like. The first package substrate 100 may include the first lower pad 102, the first upper pad 104, and the first chip pad 106.

In some example embodiments, the circuit element 140 may be disposed on the first package substrate 100. The circuit element 140 may be, for example, a capacitor.

Referring to FIG. 14, the first semiconductor chip 110 is mounted above the first package substrate 100.

For example, the first semiconductor chip 110 on which the first chip bump 120 is formed may be provided. The first chip bump 120 may be formed on the bottom surface of the first semiconductor chip 110. Subsequently, the first chip bump 120 may be connected to the first chip pad 106. As one example, the first chip bump 120 may include the first pillar layer 122 and the first solder layer 124. The first solder layer 124 may be attached onto the first chip pad 106 by soldering or the like. Accordingly, the first package substrate 100 and the first semiconductor chip 110 may be electrically connected to each other.

In some example embodiments, the first semiconductor chip 110 may be an application processor chip.

In some example embodiments, the underfill 130 may be further formed between the first package substrate 100 and the first semiconductor chip 110. The underfill 130 may fill a region between the first package substrate 100 and the first semiconductor chip 110.

Figure 15:
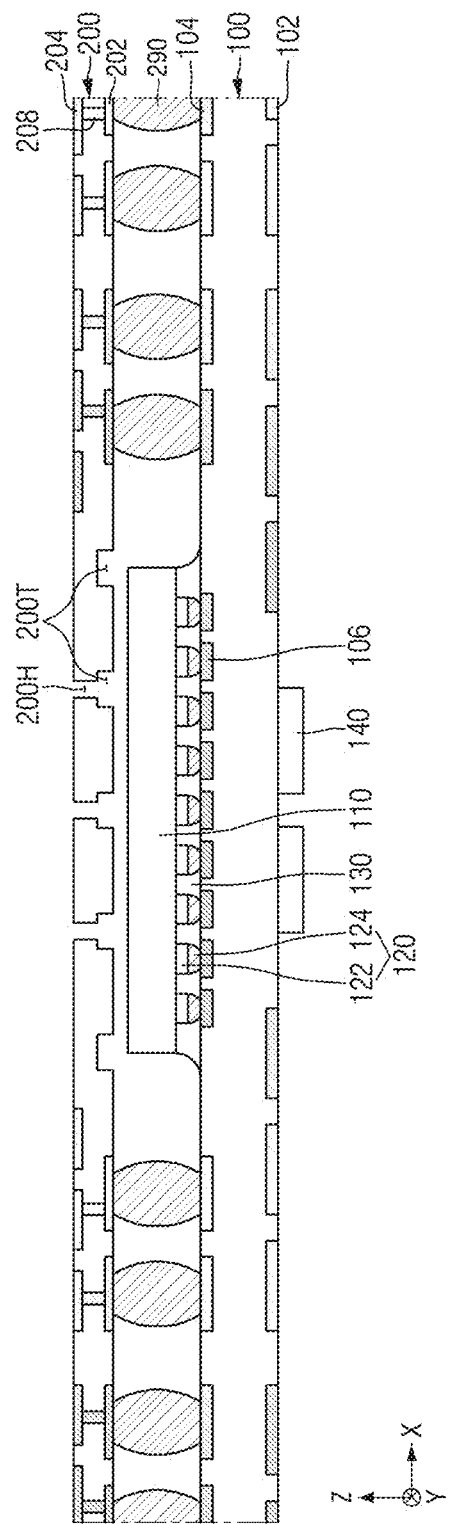

Referring to FIG. 15, the interposer 200 is disposed above the top surface of the first package substrate 100 and the top surface of the first semiconductor chip 110.

The interposer 200 may include the second lower pad 202 and the second upper pad 204. In some example embodiments, the interposer 200 may further include the through via 208.

The interposer 200 may be electrically connected to the first package substrate 100. For example, the second connection member 290 may be formed between the first package substrate 100 and the interposer 200. The second connection member 290 may be attached onto the first upper pad 104 of the first package substrate 100 and the second lower pad 202 of the interposer 200 by soldering or the like. Accordingly, the second connection member 290 may electrically connect the first package substrate 100 to the interposer 200.

The interposer 200 may include the interposer trench 200T and the interposer hole 200H. The interposer trench 200T may be formed by being recessed from the bottom surface of the interposer 200. For example, the interposer trench 200T may be recessed from the bottom surface of the interposer 200 in the first direction Z. The interposer hole 200H may be formed to penetrate the interposer 200. For example, the interposer hole 200H may extend in the first direction Z to penetrate the interposer 200.

At least a part of the interposer trench 200T and at least a part of the interposer hole 200H may each overlap the first semiconductor chip 110. In some example embodiments, at least a part of the interposer trench 200T may be disposed to overlap the edge of the first semiconductor chip 110. In some example embodiments, at least some of the plurality of interposer holes 200H may overlap the interposer trench 200T. In some example embodiments, the width of the interposer hole 200H may be smaller than the width of the interposer trench 200T.

Figure 16:
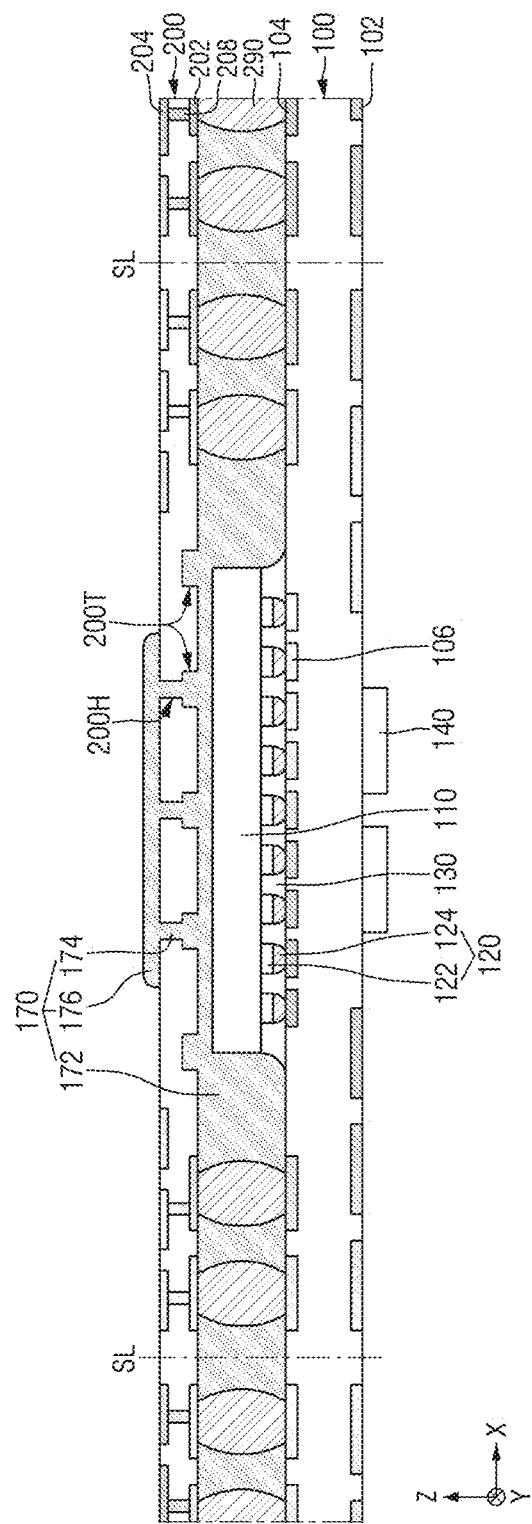

Referring to FIG. 16, the first molding layer 170 is formed.

For example, a fluid molding material may be injected between the first package substrate 100 and the interposer 200. The molding material may include, for example, an insulating polymer material such as an epoxy molding compound (EMC), but is not limited thereto.

The molding material injected and flown between the first package substrate 100 and the interposer 200 may fill a region between the first package substrate 100 and the interposer 200. The flowing molding material may fill the interposer trench 200T and a region between the first semiconductor chip 110 and the interposer 200. Accordingly, the first molding layer 170 including the filling portion 172 may be formed. Because the interposer trench 200T may be recessed from the bottom surface of the interposer 200, an additional space may be secured between the first semiconductor chip 110 and the interposer 200 to improve the fluidity of the molding material.

Further, the flowing molding material may pass through the interposer hole 200H and be discharged from the top surface of the interposer 200. The discharged molding material may cover at least a part of the top surface of the interposer 200. Accordingly, the first molding layer 170 including the through portion 174 and the cover portion 176 may be formed. In some example embodiments, the cover portion 176 may connect the plurality of through portions 174, which are spaced apart from each other, to each other.

In some example embodiments, the molding material may be injected along the extension direction of the interposer trench 200T. For example, the interposer trench 200T may be elongated along the second direction Y, and the molding material may be injected to flow along the second direction Y.

Figure 17:
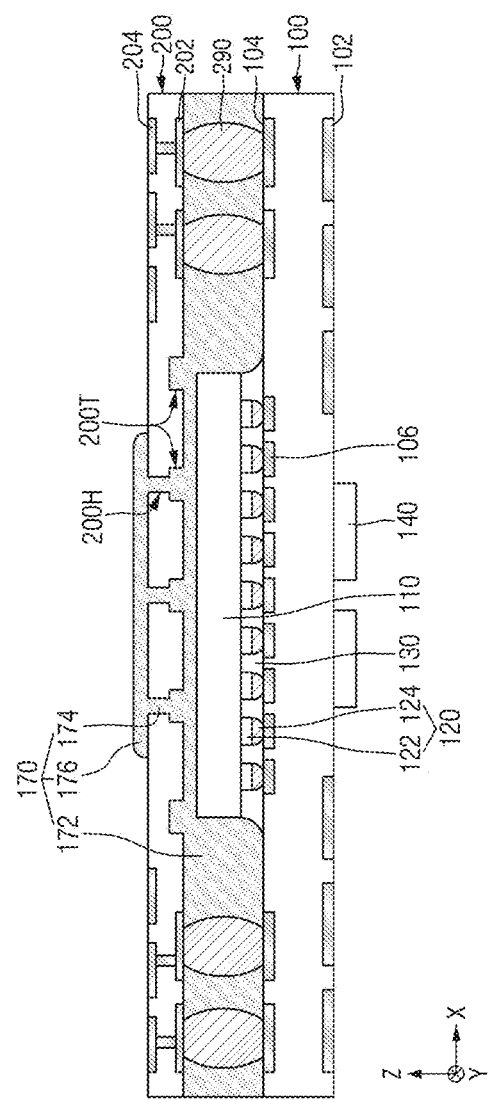

Referring to FIG. 17, the first package substrate 100 and the interposer 200 are cut.

For example, a scribe line SL (see FIG. 16) defining a unit package area around the first semiconductor chip 110 may be provided. The first package substrate 100 and the interposer 200 may be cut along the scribe line SL (see FIG. 16). Accordingly, a semiconductor package cut for each unit package area including the first semiconductor chip 110 may be provided.

It is only shown that the first package substrate 100 and the interposer 200 are cut after the first molding layer 170 is formed, but this is merely an example. As another example, the first molding layer 170 may be formed after the first package substrate 100 and the interposer 200 are cut.

Subsequently, referring to FIGS. 1 to 4, the second package substrate 300, the second semiconductor chip 310, and the second molding layer 270 are formed above the interposer 200. Accordingly, a method for fabricating a semiconductor package with improved product reliability can be provided.

Figure 18:
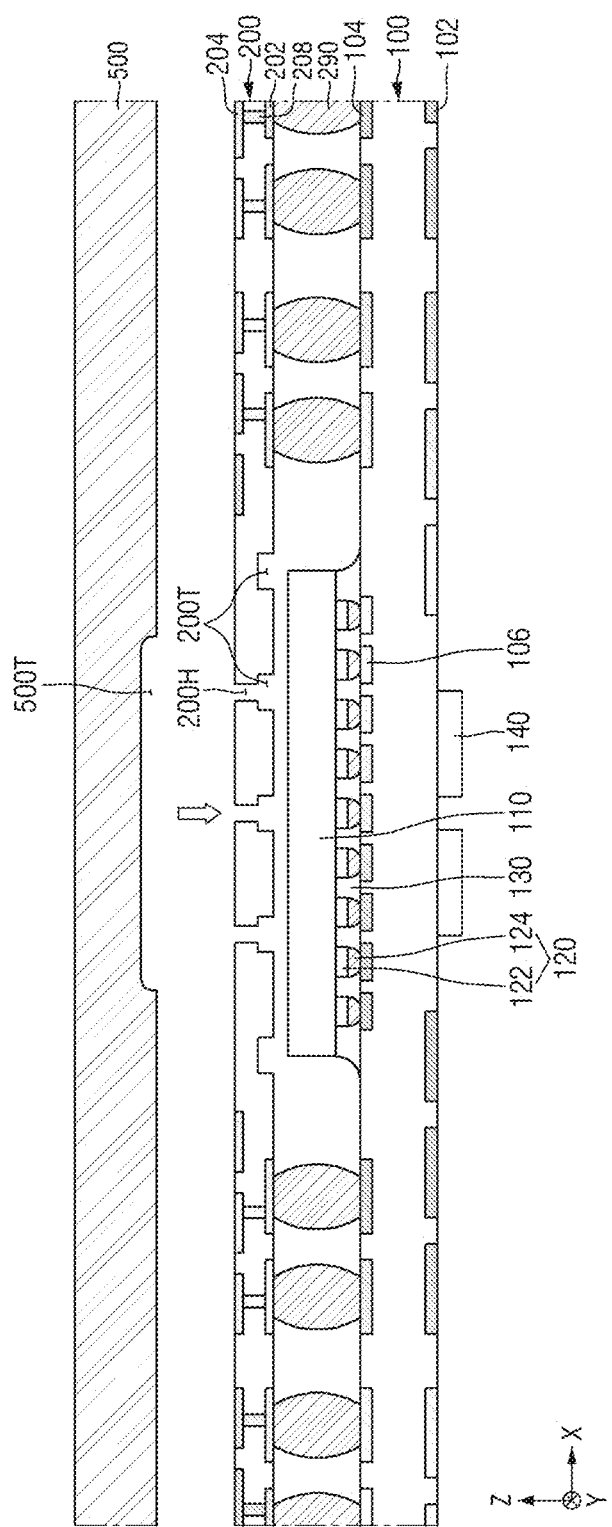
FIGS. 18 and 19 are views illustrating intermediate steps of a method for fabricating a semiconductor package according to some example embodiments.
Figure 19:
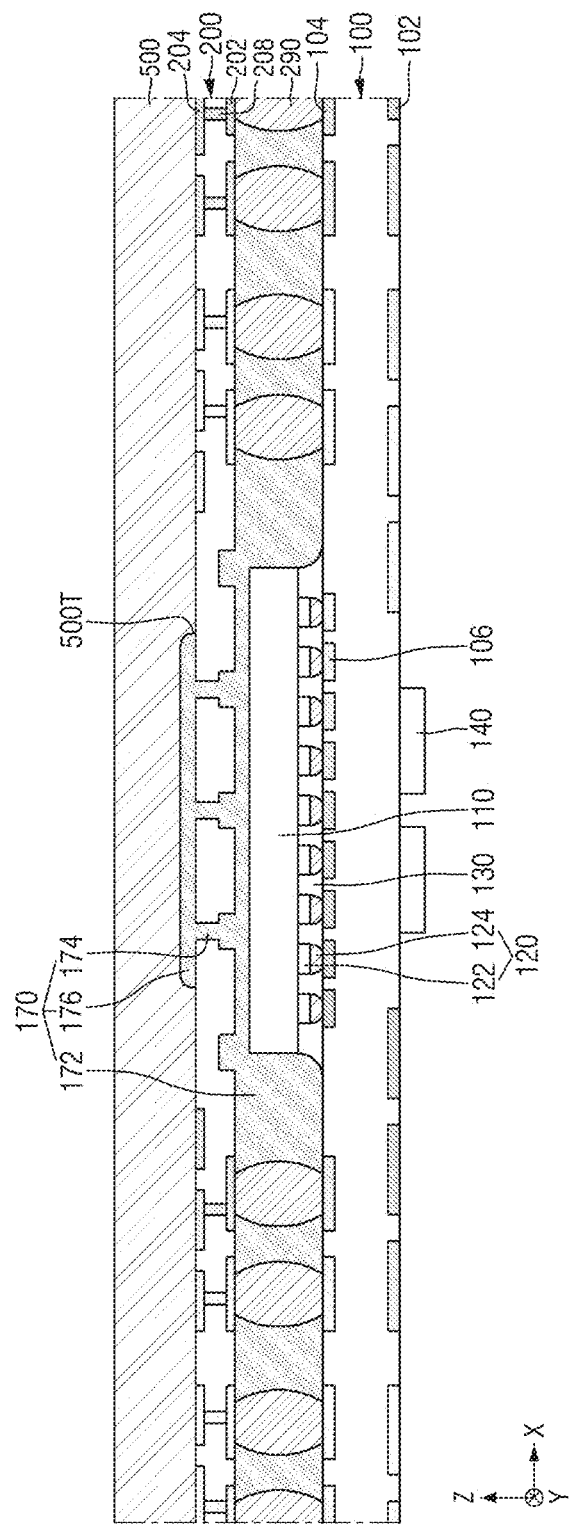

FIGS. 18 and 19 are views illustrating intermediate steps of a method for fabricating a semiconductor package according to some example embodiments. For simplicity of description, a description overlapping with the description with reference to FIGS. 1 to 4 and 13 to 17 will be briefly given or omitted. For reference, FIG. 18 is a diagram for describing the steps after FIG. 15.

Referring to FIG. 18, a mold 500 is provided on the top surface of the interposer 200.

The mold 500 may include a cavity 500T. The cavity 500T may be recessed from the bottom surface of the mold 500. When the mold 500 is disposed on the top surface of the interposer 200, the cavity 500T may be fluidly connected to the interposer hole 200H. For example, the cavity 500T may be disposed to overlap the plurality of interposer holes 200H in the first direction Z.

Referring to FIG. 19, the first molding layer 170 is formed using the mold 500.

For example, after the mold 500 is disposed on the top surface of the interposer 200, a fluid molding material may be injected between the first package substrate 100 and the interposer 200. The flowing molding material may pass through the interposer hole 200H to fill the cavity 500T. Accordingly, the first molding layer 170 including the through portion 174 and the cover portion 176 may be formed. After the first molding layer 170 is formed, the mold 500 may be removed.

Subsequently, the steps described above with reference to FIGS. 16 and 17 and FIGS. 1 to 4 may be performed. Accordingly, a method for fabricating a semiconductor package with improved product reliability can be provided.

In concluding the detailed description, those skilled in the art will appreciate that many variations and modifications may be made to the disclosed example embodiments without substantially departing from the principles of the present inventive concepts. Therefore, the disclosed example embodiments of the present inventive concepts are used in a generic and descriptive sense only and not for purposes of limitation.

What is claimed is:

1. A semiconductor package comprising:
a first package substrate;
a first semiconductor chip on a top surface of the first package substrate;
an interposer electrically connected to the first package substrate on a top surface of the first semiconductor chip; and
a molding layer configured to cover the first package substrate and the first semiconductor chip,
wherein the interposer includes an interposer trench recessed from a bottom surface of the interposer and an interposer hole penetrating the interposer, the bottom surface of the interposer facing both the top surface of the first semiconductor chip and the top surface of the first package substrate,
the molding layer includes a filling portion filling a region between the first package substrate and the interposer, a through portion filling the interposer hole, and a cover portion covering at least a part of a top surface of the interposer,
a bottommost surface of the interposer is directly above the top surface of the first semiconductor chip, based on the top surface of the first package substrate, and
a maximum width of the interposer trench is smaller than a maximum width of the first semiconductor chip.

2. The semiconductor package of claim 1, wherein the interposer is spaced apart from the top surface of the first semiconductor chip, and
the filling portion fills a region between the first semiconductor chip and the interposer.

3. The semiconductor package of claim 1, further comprising:

another interposer trench recessed from the bottom surface of the interposer and overlapping an edge of the first semiconductor chip in a plan view such that an entirety of the another interposer trench is above the first semiconductor chip.

4. The semiconductor package of claim 1, wherein the interposer trench is arranged in plural number along a first direction parallel to the bottom surface of the interposer.

5. The semiconductor package of claim 4, wherein the interposer trench arranged in plural number is parallel to the top surface of the first package substrate and extends along a second direction crossing the first direction.

6. The semiconductor package of claim 1, wherein the filling portion, the through portion, and the cover portion are portions of an integral body.

7. The semiconductor package of claim 1, wherein the interposer includes a lower pad exposed from the bottom surface of the interposer, an upper pad exposed from the top surface of the interposer, and a through via penetrating the interposer to connect the lower pad to the upper pad.

8. The semiconductor package of claim 1, further comprising:
a connection member on the top surface of the first package substrate, the connection member electrically connecting the first package substrate to the interposer, wherein the molding layer covers the connection member.

9. The semiconductor package of claim 1, further comprising:
a second package substrate on the top surface of the interposer, the second package substrate being electrically connected to the interposer; and
a second semiconductor chip on a top surface of the second package substrate that faces the top surface of the interposer.

10. The semiconductor package of claim 1, wherein the molding layer includes an epoxy molding compound (EMC).

11. A semiconductor package comprising:
a package substrate;
a semiconductor chip on a top surface of the package substrate; and
an interposer on a top surface of the semiconductor chip, the interposer being spaced apart from the semiconductor chip and electrically connected to the package substrate,
wherein the interposer includes,
an interposer trench recessed from a bottom surface of the interposer and configured to overlap the semiconductor chip in plan view, the bottom surface of the interposer facing both the top surface of the semiconductor chip and the top surface of the package substrate, and
an interposer hole extending from the interposer trench to penetrate the interposer, the interposer hole having a width smaller than that of the interposer trench,
wherein a bottommost surface of the interposer is directly above the top surface of the semiconductor chip, based on the top surface of the package substrate, and
wherein a maximum width of the interposer trench is smaller than a maximum width of the semiconductor chip.

12. The semiconductor package of claim 11, wherein the interposer trench extends in a first direction parallel to the surface of the package substrate.

13. The semiconductor package of claim 12, wherein a width of the interposer hole is smaller than a width of the interposer trench in a second direction that is parallel to the top surface of the package substrate and crosses the first direction.

14. The semiconductor package of claim 11, wherein at least a part of the interposer trench overlaps an edge of the semiconductor chip in plan view.

15. The semiconductor package of claim 11, further comprising:
a molding layer covering the package substrate and the semiconductor chip and filling the interposer trench and the interposer hole.

16. The semiconductor package of claim 15, wherein a part of the molding layer covers at least a part of a top surface of the interposer.

17. A semiconductor package comprising:
a first package substrate;
a first semiconductor chip on a top surface of the first package substrate;
a second package substrate on a top surface of the first semiconductor chip;
a second semiconductor chip on a top surface of the second package substrate;
an interposer spaced apart from the first semiconductor chip and between the first semiconductor chip and the second package substrate;
a first connection member between the first package substrate and the interposer, the first connection member electrically connecting the first package substrate to the interposer;
a molding layer on the top surface of the first package substrate, the molding layer covering the first connection member and the first semiconductor chip; and
a second connection member between the interposer and the second package substrate, the second connection member electrically connecting the interposer to the second package substrate,
wherein the interposer includes an interposer trench recessed from a bottom surface of the interposer and an interposer hole penetrating the interposer, the bottom surface of the interposer facing both the top surface of the first semiconductor chip and the top surface of the first package substrate,
the molding layer fills the interposer trench and the interposer hole,
a bottommost surface of the interposer is directly above the top surface of the first semiconductor chip, based on the top surface of the first package substrate, and
a maximum width of the interposer trench is smaller than a maximum width of the first semiconductor chip.

18. The semiconductor package of claim 17, wherein a part of the molding layer covers at least a part of a top surface of the interposer.

* * * * *